March 14, 1967 J. D. ZOOK ET AL 3,309,240

TUNNEL DIODES

Filed July 2, 1964

INVENTORS
JAMES DAVID ZOOK,
HELMUT J. HORNUNG
BY
Robert O. Vidas
ATTORNEY

United States Patent Office 3,309,240

Patented Mar. 14, 1967

3,309,240
TUNNEL DIODES

James David Zook, Savage, and Helmut J. Hornung, Excelsior, Minn., assignors to Honeywell Inc., Minneapolis, Minn., a corporation of Delaware Filed July 2, 1964, Ser. No. 379,971
3 Claims. (Cl. 148—33.1)

Figure 1A:
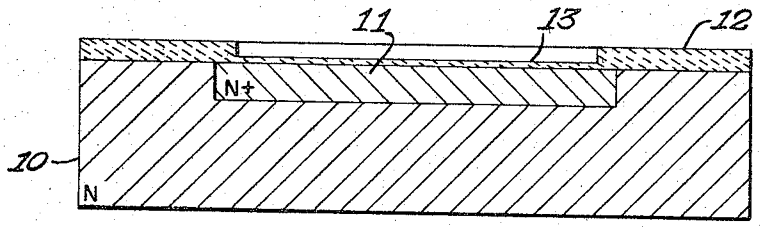

The present invention is directed to tunnel diodes and to a method of making the same. More specifically, the present invention is directed to a tunnel diode wherein the junction area is controlled precisely.

Tunnel diodes have become well-known in the semiconductor art since their development some years ago. For many applications it is considered desirable to increase the impedance of the tunnel diode. The obvious way in which to increase the impedance is to reduce the area of the junction between the heavily doped N and P type regions comprising the tunnel diode. Previous investigators have used a variety of schemes to accomplish this purpose. For example, one such scheme involves the use of an extremely thin, highly doped surface on a semiconductor device wherein a second highly doped region of opposite conductivity type is produced by alloying through the first region into the main body of the semiconductor body. This process of alloying through the thin surface region of heavily doped material provides a tunnel diode junction in a ring form through the depth of the heavily doped region; the balance of the alloying material forming an ordinary diode with the main body of the semiconductor chip. By such a technique it is possible to obtain tunnel diodes having relatively small areas of junction.

The prior art techniques of providing small area tunnel diode devices do not entirely satisfy the need for extremely small, nor precisely controlled tunnel diode junctions. In the instance of the alloying through the heavily doped region discussed above the actual area of the tunnel diode junction is a function of the perimeter of the alloying material. As is well-known, it is difficult to control the actual size of an alloy region in a semiconductor device. Diffusion techniques permit highly precise control of areas, but diffusion techniques are not satisfactory for the production of tunnel diodes.

The present invention provides a means for controlling both the area of the junction and simultaneously provides a means of obtaining an extremely small tunnel diode device. It does this through a combination of diffusion techniques and alloying techniques. Briefly, a highly doped strip of semiconductor material is produced in the main body of a semiconductor chip by oxide masking and diffusion techniques. Subsequent to the production of this narrow strip of highly doped material a button of alloy substance is alloyed through the end of the strip so as to provide a junction between the main body of the alloyed region and the end portion of the strip as will be shown in the discussion below.

Accordingly, it is an object of the present invention to provide a tunnel diode having close dimensional control and being capable of being produced in an extremely small area.

It is a further object of the present invention to provide a combination diffused and alloyed tunnel diode device.

Figure 1B:
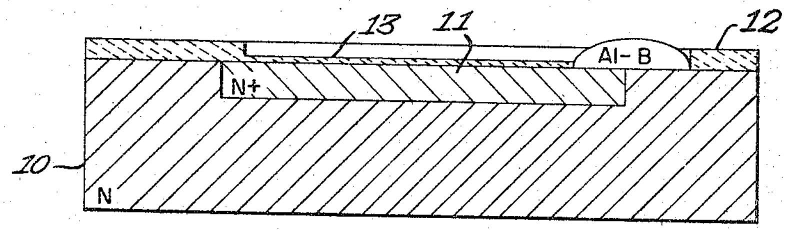
Figure 1C:
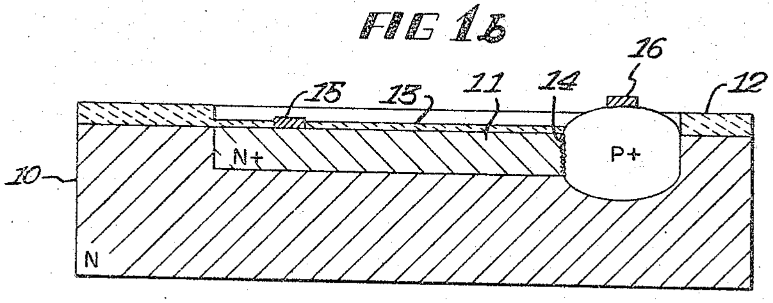
Figure 2:
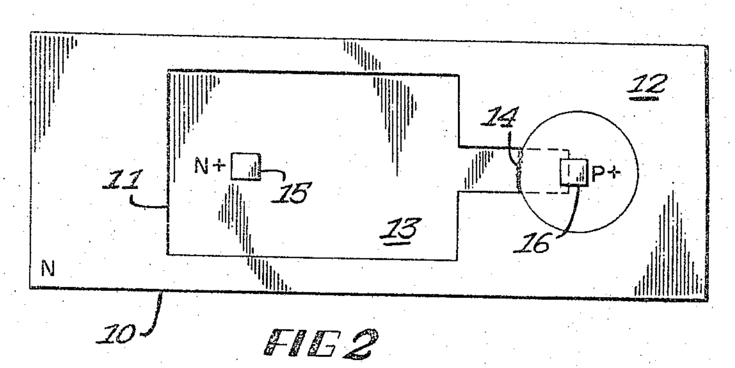

Further objects will be apparent from a study of the following specification and drawing wherein:

FIGURE 1*a–c* represents a sectional view of the process of making a tunnel diode made in accordance with the present invention;

FIGURE 2 is a top plan view of a tunnel diode made in accordance with the present invention.

Referring now to FIGURE 1*a* there is seen a body of single crystal silicon 10 of N type having an impurity concentration of less than about $10^{18}$ atoms/cm.$^3$ and preferably about $10^{16}$ atoms/cm.$^3$, having diffused into a portion of the upper surface thereof a region of heavily doped N type material designated N+. This N+ region is designated 11. This N+ region can be produced by diffusion of phosphorus or the like to form a region having an impurity concentration of greater than $10^{19}$ atoms/cm.$^3$. On the surface of the semiconductor body there is a region of relatively thick silicon oxide 12 (about 1200 A.) which has been used as the mask material in producing the diffused region 11. This technique of providing diffusion through a mask of silicon oxide grown on the surface of the semiconductor is well-known in the art. A thinner layer of silicon oxide 13 is located above the diffused region 11. This somewhat thinner layer of oxide has resulted from regrowth of the oxide over the area where the oxide was removed during the initial stages of the production of region 11, again a process well-known to those skilled in the art. In FIGURE 1*b* the oxide films 12 and 13 have been partially removed at one portion of diffused region 11 so as to expose a portion of both region 11 and the main body of the semiconductor 10. Into the exposed surface area has been placed a pellet of alloy material, which in this particular instance is an alloy of aluminum and boron ($Al_{99}B_1$). Although in this particular description the oxide material has been removed from the surface where the aluminum-boron is to be alloyed into the main body of the material, it should be appreciated that the removal of the oxide is not mandatory. The aluminum-boron is capable of penetrating through relatively thin oxide layers and it is possible to perform the alloying step without removal of the oxide. However, removal of the oxide is desirable in this alloying step to insure greater ease of manufacture.

In FIGURE 1*c* the aluminum-boron alloy has been actually alloyed into the body of the semiconductor material 10 and through a portion of region 11. In the course of melting of the aluminum boron alloy a portion of the silicon material underlying the alloy is solubilized into the alloy and upon recrystallization the resulting material becomes highly doped to become P+. The heavily doped N+ region 11 that has been solubilized into the P+ has been so dispersed that it no longer has a high concentration of N+ material. Rather, it has become P+ with an extremely abrupt junction at 14. As was previously noted above, diffusion will not provide this abrupt junction due to the fact that the first heavily doped region must be compensated for by the second impurity in a diffusion before the high concentration of the second impurity can become sufficiently concentrated to form a tunnel diode region. This is virtually impossible due to the limited solubilities of the materials that are used in doping. This P+ region has now formed a tunnel diode generally labeled 14 with the N+ region 11 and forms an ordinary diode between the P+ region and the main bulk of body 10. Also shown are ohmic contacts 15 and 16 to the N+ and P+ regions and leads therefor.

In FIGURE 2 there is shown in plan form a top view of the device of FIGURE 1*c*. As can be seen, the tunnel diode area is controlled precisely by the width of the N+ region at the alloying point and by the depth of the N+ region. In the preferred form of the device shown a broad area is provided in the diffused region to give lower series resistance. It is known that diffused regions, such as region 11, can be produced both in extremely thin penetration into the body of the semiconductor material —as low as .1 micron or even less—and that the width of such diffused region can be precisely controlled down to as little as .1 mil. As can be seen from the figures it is thus readily possible to make tunnel diodes having a total area which is a product of the thickness of the penetration of the diffused impurity by the width of the diffusion strip 11. In the particular figures cited in connection with this example, the actual junction area would be approximately $2.5\times10^{-9}$ sq. cm.

While the present invention does provide a means of obtaining extremely small tunnel diodes it likewise provides a means of obtaining extremely closely controlled areas in tunnel diodes of larger form. Diffusion techniques are now well controlled so that the depth of penetration can be determined quite precisely. Likewise, the width can be precisely controlled so that the total area of a junction can be readily maintained in some desired range. As can be seen from the above description the diameter of the alloy pellet to be used in manufacturing the tunnel diode is of relative non-importance. The excess area involved does not effect tunnel diode action and is only detrimental in using a certain additional amount of surface area of a wafer and in producing parasitic capacitance.

While the above description has been given with regard to production of a tunnel diode wherein an N+ diffused region is used in conjunction with a P type alloy material it should be readily appreciated that the opposite situation can also be used. That is, a P type semiconductor body having a P+ diffused region produced by diffusion of boron into a portion of the surface in a manner analogous to that described above can form the basis for producing a tunnel diode. In this latter instance an alloy substance comprising a carrier metal such as lead containing a quantity of arsenic to act as the dopant may be used. This then produces an alloy region of N+ into a P type body containing a strip of P+ material.

Likewise, while the examples have been described with regard to production of the tunnel diode in a single crystal body, the tunnel diode of the invention may also be produced in polycrystalline material.

Having described our invention we claim:

1. A tunnel diode comprising:

(a) a body of single crystal semiconductor material of a first conductivity type having an impurity concentration of less than $10^{18}$ atoms per cc., (b) an elongated region of highly doped first conductivity type material located in a portion only of one surface of said body, (c) and a region of highly doped opposite conductivity extending entirely across and completely through a terminal end portion of said elongated region such that the tunnel diode junction area is determined solely by the width and depth of the elongated region.

2. A tunnel diode comprising:

(a) a body of single crystal N-type silicon having an impurity concentration of less than $10^{18}$ atoms per cc., (b) an elongated region of N+ silicon located in a portion only of one surface of said body, (c) and, a region of P+ silicon extending entirely across and completely through a terminal end portion of said N+ region such that the tunnel diode junction area is determined solely by the width and depth of the elongated region.

3. A tunnel diode comprising:

(a) a body of single crystal P-type silicon having an impurity concentration of less than $10^{18}$ atoms per cc., (b) an elongated region of P+ silicon located in a portion only of one surface of said body, (c) and, a region of N+ silicon extending entirely across and completely through a terminal end portion of said P+ region such that the tunnel diode junction area is determined solely by the width and depth of the elongated region.

References Cited by the Examiner

UNITED STATES PATENTS

| | | | |
|---|---|---|---|
| 3,079,512 | 2/1963 | Rutz | 148—33.1 X |
| 3,105,177 | 9/1963 | Aigrain et al. | 148—33.1 X |
| 3,114,864 | 12/1963 | Sah | 317—234 |

HYLAND BIZOT, *Primary Examiner.*

CHARLES N. LOVELL, *Examiner.*